(12) United States Patent
Dimmock (10) Patent No.: US 8,859,909 B2
(45) Date of Patent: Oct. 14, 2014

(54) FLEXIBLE CABLE FOR LOW PROFILE ELECTRICAL DEVICE

(75) Inventor: Gary Dimmock, Taunton (GB)

(73) Assignee: Amphenol Thermometrics, Inc., St. Marys, PA (US)

(*) Notice: Subject to any disclaimer, the term of this patent is extended or adjusted under 35 U.S.C. 154(b) by 117 days.

(21) Appl. No.: 13/410,857

(22) Filed: Mar. 2, 2012

(65) Prior Publication Data

US 2013/0230755 A1  Sep. 5, 2013

(51) Int. Cl.
  *H05K 1/00* (2006.01)
  *H05K 1/02* (2006.01)

(52) U.S. Cl.
  CPC .................................. *H05K 1/028* (2013.01)
  USPC ........................................................ 174/254

(58) Field of Classification Search
  CPC .... H05K 1/028; H05K 1/0281; H05K 1/0283
  USPC .................................. 174/254; 361/749–751
  See application file for complete search history.

(56) References Cited

U.S. PATENT DOCUMENTS

| 8,511,185 | B2 | 8/2013 | Lee et al. |
| 8,523,430 | B2 | 9/2013 | Lee et al. |
| 2008/0094753 | A1 | 4/2008 | Brodkin et al. |
| 2009/0121346 | A1 | 5/2009 | Wachtler |
| 2011/0042774 | A1 | 2/2011 | Kloiber et al. |
| 2012/0028083 | A1 | 2/2012 | Jung |

FOREIGN PATENT DOCUMENTS

| DE | 19607179 C1 | 7/1997 |
| EP | 0652692 A1 | 5/1995 |
| JP | 2002319781 A | 10/2002 |
| JP | 2005175343 A | 6/2005 |
| JP | 2010122088 A | 6/2010 |

OTHER PUBLICATIONS

NTC Thermistors: Type FL, Chip in Flexible PCB Assembly, Crown Industrial Estate, Priorswood Road, Taunton, Somerset TA2 8QY United Kingdom, 1 page.
Search Report from PCT/US2013/027438 dated Jun. 5, 2013.

*Primary Examiner* — Jeremy C Norris
(74) *Attorney, Agent, or Firm* — Blank Rome LLP (57) ABSTRACT

A flexible cable with a substrate divided into at least two sections is disclosed. The first section includes a first electrically conductive track and a first attach pad, while the section includes a second and third electrically conductive tracks, as well as a second attach pad. The first section is disposed on the second section to align the attach pads and connect the first electrically conductive track to the third electrically conductive track. The resulting flexible cable can be used with a low profile electrical device.

11 Claims, 7 Drawing Sheets

FLEXIBLE CABLE FOR LOW PROFILE ELECTRICAL DEVICE

BACKGROUND OF THE INVENTION

The subject matter disclosed herein relates to a flexible cable for a low profile electrical device.

Many applications require a sensor, such as a temperature or pressure sensor, be located in a confined space. Low profile sensors are designed to fit into these confined spaces and relay the sensed condition to a data processing device. There are situations where the confined spaces are also subject to stresses such as vibration, expansion and contraction of nearby objects as well as moisture and other environmental pressures. Conventional low profile sensors are often too fragile for these demanding environments. For example, low profile sensors that are mounted on ceramic substrates can crack if used in these high-stress environments. Low profile sensors that are mounted on flexible substrates typically bend their conductive tracks at angles that can break the required electrical connections. A low profile sensor with improved durability is desired.

The discussion above is merely provided for general background information and is not intended to be used as an aid in determining the scope of the claimed subject matter.

BRIEF DESCRIPTION OF THE INVENTION

A flexible cable with a substrate divided into at least two sections is disclosed. The first section includes a first electrically conductive track and a first attach pad, while the section includes a second and third electrically conductive tracks, as well as a second attach pad. The first section is disposed on the second section to align the attach pads and connect the first electrically conductive track to the third electrically conductive track. The resulting flexible cable can be used with a low profile electrical device. An advantage that may be realized in the practice of some disclosed embodiments of the flexible cable is improved durability by ensuring the foldable section is free of electrically conductive contacts that could be damaged during folding. Another advantage that may be realized in the practice of some disclosed embodiments of the flexible cable is a reduction in size of the sensing head.

In one exemplary embodiment, a flexible cable is disclosed. The flexible cable comprises a first section and a second section with a third section between the first and second sections. The first section comprises a first electrically conductive track with a first attach pad. The second section comprises a second electrically conductive track, a third electrically conductive track and a second attach pad. The third section comprises a foldable line wherein the first attach pad will align with the second attach pad when the first section is folded onto the second section.

In another exemplary embodiment, a flexible cable is disclosed. The flexible cable comprises first and second flexible substrates. The first flexible substrate comprises a first electrically conductive track and a first attach pad. The second flexible substrate comprises a second electrically conductive track, a third electrically conductive track and a second attach pad. An electrical device is disposed between the first attach pad and the second attach pad. The first flexible substrate is disposed on the second flexible substrate such that the first attach pad is aligned with the second attach pad and the first electrically conductive track is placed in electrical contact with the third electrically conductive track.

In another exemplary embodiment, a battery pack is disclosed. The battery back comprises at least two adjacent battery cell pouches that define a space. A flexible cable is present for sensing a temperature within the battery pack. The flexible cable comprises first and second flexible substrates. The first flexible substrate comprises a first electrically conductive track and a first attach pad. The second flexible substrate comprises a second electrically conductive track, a third electrically conductive track and a second attach pad. A temperature sensor is disposed between the first attach pad and the second attach pad. The first flexible substrate is disposed on the second flexible substrate such that the first attach pad is aligned with the second attach pad and the first electrically conductive track is placed in electrical contact with the third electrically conductive track.

This brief description of the invention is intended only to provide a brief overview of subject matter disclosed herein according to one or more illustrative embodiments, and does not serve as a guide to interpreting the claims or to define or limit the scope of the invention, which is defined only by the appended claims. This brief description is provided to introduce an illustrative selection of concepts in a simplified form that are further described below in the detailed description. This brief description is not intended to identify key features or essential features of the claimed subject matter, nor is it intended to be used as an aid in determining the scope of the claimed subject matter. The claimed subject matter is not limited to implementations that solve any or all disadvantages noted in the background.

BRIEF DESCRIPTION OF THE DRAWINGS

So that the manner in which the features of the invention can be understood, a detailed description of the invention may be had by reference to certain embodiments, some of which are illustrated in the accompanying drawings. It is to be noted, however, that the drawings illustrate only certain embodiments of this invention and are therefore not to be considered limiting of its scope, for the scope of the invention encompasses other equally effective embodiments. The drawings are not necessarily to scale, emphasis generally being placed upon illustrating the features of certain embodiments of the invention. In the drawings, like numerals are used to indicate like parts throughout the various views. Thus, for further understanding of the invention, reference can be made to the following detailed description, read in connection with the drawings in which.

DETAILED DESCRIPTION OF THE INVENTION

Figure 1:
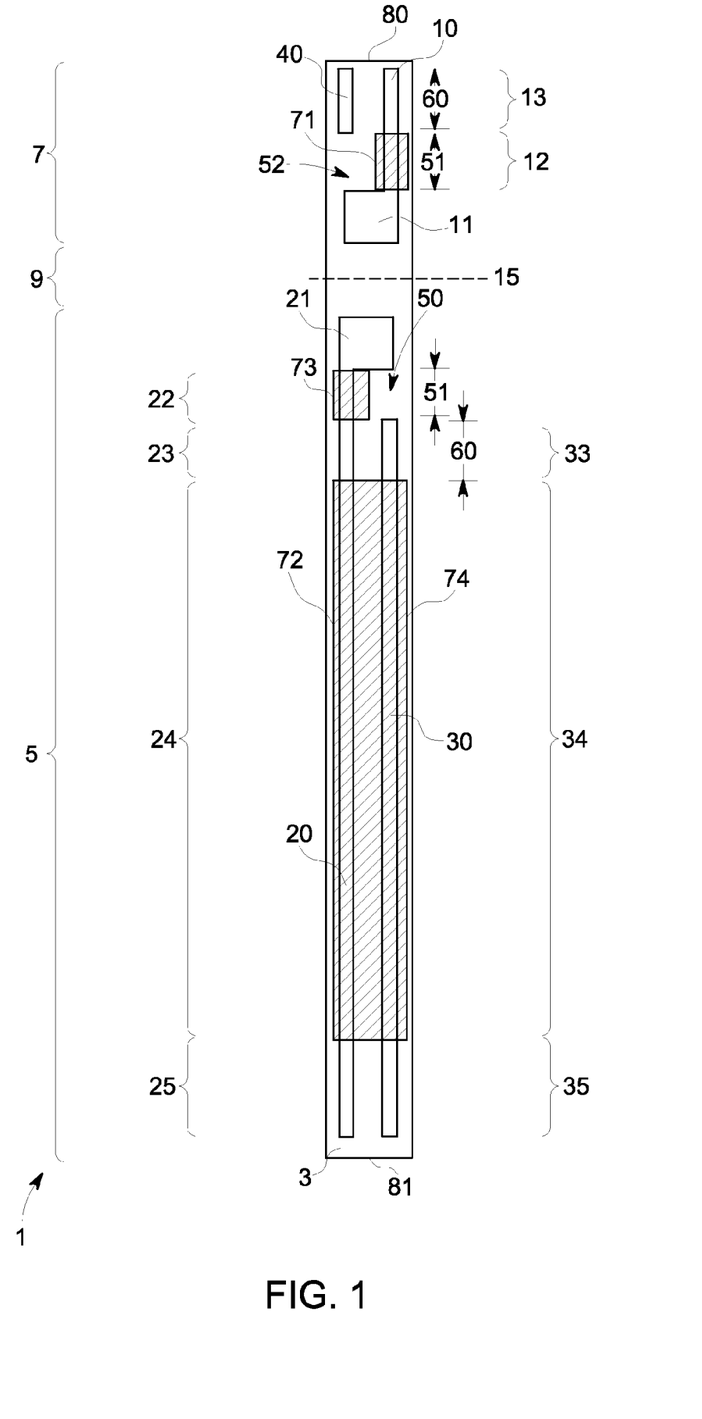
FIG. 1 is a top view of an exemplary flexible cable shown in an unfolded configuration.

FIG. 1 is a top view of an exemplary flexible cable 1 (or flat flexible cable) shown in an unfolded configuration. The flexible cable 1 is comprised of a flexible substrate 3 that has a first section 7 at first end 80, second section 5 at second end 81, and a third section 9 between the first section 7 and the second section 5. The first section 7 is designed to be bent about fold line 15 such that the components on the first section 7 align with corresponding components on the second section 5. The flexible substrate 3 is a flexible, electrically insulting material. Examples of suitable materials include polymeric materials. In one embodiment, the flexible substrate 3 is formed of a polyimide. In one such embodiment, the polyimide is KAPTON.

The first section 7 comprises a first electrically conductive track 10 and a first attach pad 11, both disposed on the flexible substrate 3. The first attach pad 11 is proximate to the third section 9 and the first electrically conductive track 10 connects to, and extends away from, the first attach pad 11 toward the first end 80 of the flexible substrate 3.

The second section 5 comprises a second electrically conductive track 20 and a second attach pad 21, both disposed on the flexible substrate 3. The first attach pad 11 and the second attach pad 21, in certain embodiments, have the same dimensions. For example, each of the first attach pad 11 and the second attach pad 21 may have a width of about 1.8 mm and a length of about 1.8 mm. The second attach pad 21 is proximate to the third section 9 and the second electrically conductive track 20 connects to, and extends away from, the second attach pad 21 toward the second end 81 of the flexible substrate 3. While the flexible cable 1 is in an unfolded state, the first attach pad 11 and the second attach pad 21 are coplanar. The first attach pad 11 and the second attach pad 21 become parallel when the flexible cable is in a folded state.

The second section 5 also comprises a third electrically conductive track 30 that is parallel to the second electrically conductive track 20. In one embodiment, the second electrically conductive track 20 and the third electrically conductive track 30 are separated by a substantially consistent distance of about 1.0 mm. The third electrically conductive track 30 extends away from the second attach pad toward the second end 81 of the flexible substrate 3 leaving a gap 50 between the second attach pad 21 and the third electrically conductive track 30.

The third section 9 of the flexible substrate 3 comprises a foldable line 15 located between the first attach pad 11 and the second attach pad 21. When the first section 7 is folded at fold line 15 such that it is disposed on the second section 5, the first attach pad 11 will align with the second attach pad 21. An electrical and mechanical connection is established between the second portion 33 of the third electrically conductive track 30 and the second portion 13 of the first electrically conductive track 10. In one embodiment, conductive solder is used to establish the electrical and mechanical connection. Since the first electrically conductive track 10 and the second electrically conductive track 20 extend along opposite edges of the flexible substrate 3, these two tracks remain electrically isolated from one another. Since the first electrically conductive track 10 and the third electrically conductive track 30 extend along the same edge of the flexible substrate 3, these two tracks become electrically connected one another when the second portion 13 contacts the second portion 33.

An electrical device (not shown in FIG. 1), such as a sensor, may be disposed between the first attach pad 11 and the second attach pad 21. The second electrically conductive track 20 provides an electrical connection to one side of the electrical device and routes that electrical connection toward the second end 81 of the flexible substrate 3 where it is accessible at the exposed third portion 25 of second electrically conductive track 20. An electrical connection to the opposite side of the electrical device is established by the first attach pad 11. This electrical signal is routed through the first portion 12 and the second portion 13 of the first electrically conductive track 10 and through the second portion 33 of the third electrically conductive track 30 toward the second end 81 of the flexible substrate 3 where it is accessible at the exposed third portion 35 of the third electrically conductive track 30. The third portion 25 of the second electrically conductive track 20 and the third portion 35 of the third electrically conductive track 30, in one embodiment, have substantially the same length. For example, both may have an exposed length of about 6.0 mm.

In the embodiment depicted in FIG. 1, the third section 9 is free of electrically conductive tracks. This track-free section can be folded without the risk of breaking a track disposed in the third section 9.

In one embodiment, the first section 7 further comprises a fourth track 40 that is parallel to the first electrically conductive track 10 and extends away from the first attach pad 11 toward the first end 80 of the flexible substrate 3, leaving a gap 52 between the first attach pad 11 and the fourth track 40. The fourth track 40 is separated from the first track 10 by a substantially constant distance of, for example, 1.0 mm. As will be discussed, the fourth track 40 remains electrically isolated from the other electrically conductive tracks and therefore need not necessarily be electrically conductive. Nevertheless, the use of an electrically conductive fourth track may be advantageous in certain circumstances to streamline production of the device and/or to provide a solder-receptive surface.

In those embodiments which utilize the fourth track 40, the track is joined to the exposed second portion 23 of the second electrically conductive track 20. This provides a mechanical connection that supplements the mechanical connection provided by the joining of second portion 33 of the third electrically conductive track with the second portion 13 of the first electrically conductive track. The fourth track 40 may be joined to the exposed second portion 23 of the second electrically conductive track 20 by any suitable adhesive means, including soldering. Since the fourth track 40 is electrically isolated from the other conductive tracks, no electrical connection need be established.

The first electrically conductive track 10, the second electrically conductive track 20, and the third electrically conductive track 30 may be formed of any flexible, electrically conductive material. In one embodiment, the tracks are formed of copper. In one embodiment, each of the tracks has the same width. For example, the first conductive track 10, the second conductive track 20, the third conductive track 30 and the fourth conductive track 40 may have a width of about 0.5 mm.

In some embodiments, one or more solder resists are used to prevent undesired electrical connections from being established and/or to protect the tracks from environmental effects. In the exemplary embodiment of FIG. 1, three such solder resists are shown. The solder resists are formed of a flexible, non-conductive material such as a polymeric compound. In one embodiment, the solder resists are formed of a polyimide. In one such embodiment, the polyimide is KAPTON. The solder resists may be formed of the same material as the flexible substrate 3 or from a different flexible, non-conductive material.

Referring again to FIG. 1, in one embodiment, a first solder resist 71 is disposed on a first portion 12 of the first electrically conductive track 10. The first solder resist 71 extends away from the first attach pad 11 toward the first end 80 of the flexible substrate 3 but leaves a second portion 13 exposed for subsequent joining to the second portion 33 of the third electrically conductive track 30. In the embodiment of FIG. 1, the first portion 12 that is covered by the first solder resist 71 is adjacent to the first attach pad 11. The first solder resist 71 has a length 51 selected to be substantially equal to the length of both the gap 52 (between the first attach pad 11 and the fourth track 40) and the gap 50 (between the second attach pad 21 and the third electrically conductive track 30). In one embodiment, the length 51 is about 2.0 mm. After folding the flexible substrate 3 about the fold line 15, the first solder resist 71 will be disposed on the gap 50. The second portion 13 of the first electrically conductive track 10 is proximate to the first end 80 of the flexible substrate 3 and adjacent to the first portion 12. The second portion 13 has a length 60 selected to be substantially equal to the length 60 of the exposed second portion 33 of the third electrically conductive track 30. In one embodiment, the length 60 is about 2.3 mm. After folding the flexible substrate 3 about the fold line 15, the second portion 13 will be disposed on the second portion 33 of the third electrically conductive track 30, thereby establishing a mechanical and electrical connection.

In one embodiment, a second solder resist 72 is disposed on a first portion 24 of the second electrically conductive track 20. The second solder resist 72 extends away from the second attach pad 21 toward the second end 81 of the flexible substrate 3 but leaves a third portion 25, proximate to the second end 81, exposed for electrical connection to an external device. In the embodiment depicted in FIG. 1, the shape of the second solder resist 72 is selected to leave a second portion 23 of the second electrically conductive track 20, which is proximate to the second attach pad 21, exposed for subsequent joining to the fourth track 40. In those embodiments where the fourth track 40 is not present, the second portion 23 may be covered with solder resist.

In one embodiment, a third solder resist 73 is disposed on a fourth portion 22 of the second electrically conductive track 20 which is adjacent to the second attach pad 21. The third solder resist 73 extends away from the second attach pad 21, toward the second end 81. In those embodiments where the fourth track 40 is present the third solder resist 73 terminates at the second portion 23 of the second electrically conductive track 20, such that the second portion 23 remains exposed for subsequent soldering. In those embodiments where the fourth track 40 is not present, the third solder resists extends to the second solder resist 72 and may be monolithic therewith.

In one embodiment, a fourth solder resist 74 is disposed on a first portion 34 of the third electrically conductive track 30. The fourth solder resist 74 extends away from the second attach pad 21 toward the second end 81 of the flexible substrate 3 but leaves a third portion 35, proximate to the second end 81, exposed for electrical connection to an external device. The fourth solder resist 74 also leaves the second portion 33 of the third electrically conductive track 30 exposed for subsequent joining with the second portion 13 of the first electrically conductive track 10. In the embodiment depicted in FIG. 1, the fourth solder resist 74 and the second solder resist 72 are monolithic. In another embodiment, the fourth solder resist 74 and the second solder resist 72 are discrete.

Figures 2, 3, 4, 5:
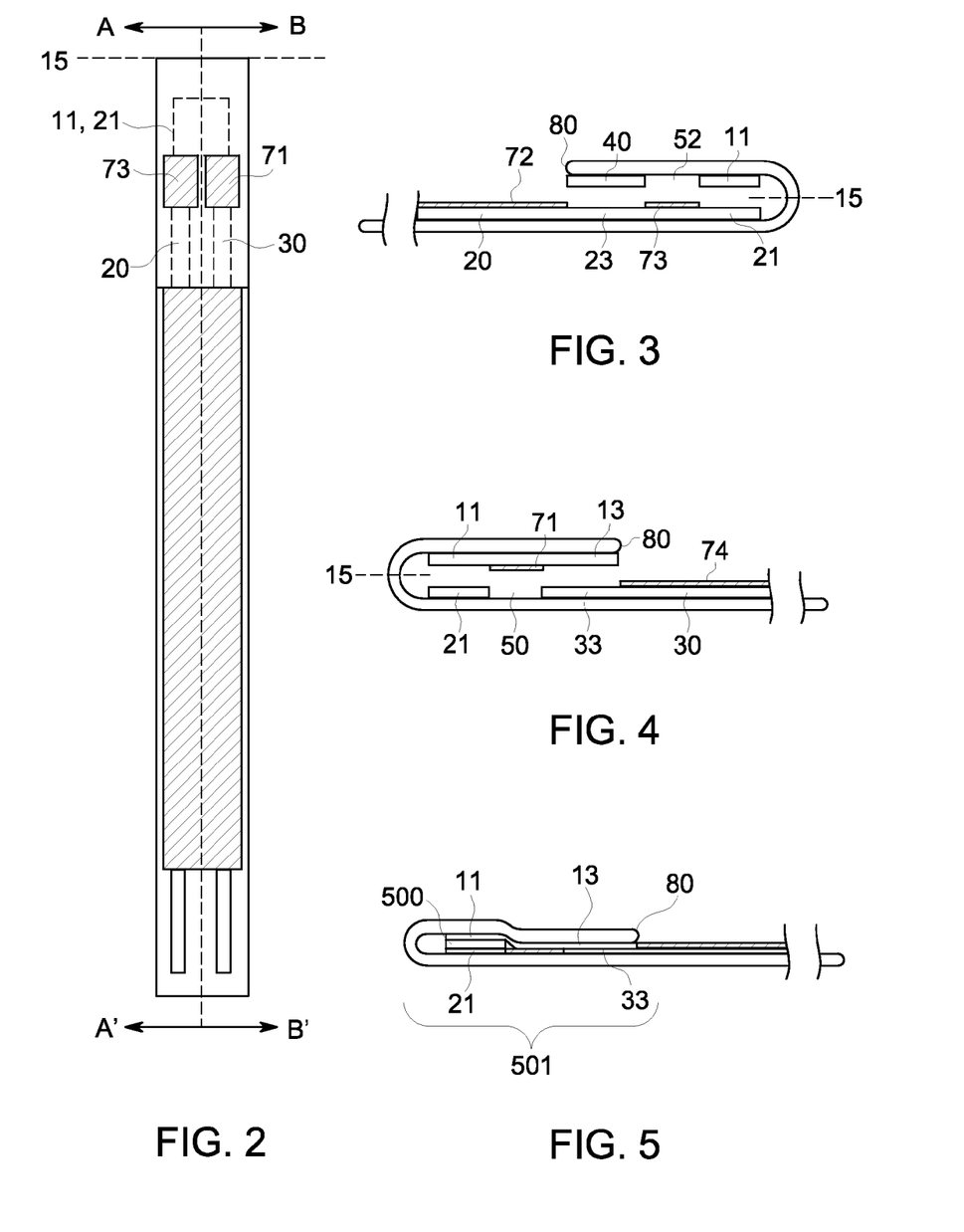
FIG. 2 is a top view of the exemplary flexible cable of FIG. 1 shown in a folded configuration.
FIG. 3 is a bisected view of the first end of the exemplary folded flexible cable of FIG. 2 shown along line A-A'.
FIG. 4 is a bisected view of the first end of the exemplary folded flexible cable of FIG. 2 shown along line B-B'.
FIG. 5 is a close-up view of the sensing head of the flexible cable of FIG. 2 shown along line B-B' with the mechanical and electrical connections assembled and with an electrical device disposed therein.

FIG. 2 is a top view of the exemplary flexible cable 1 of FIG. 1 shown in a folded configuration. For the sake of illustration, the first section 7 and the third section 9 are depicted as transparent to reveal the underlying components (shown in dashed line format). FIG. 3 is a bisected view of the first end 80 of the exemplary folded flexible cable 1 of FIG. 2 shown along line A-A'. FIG. 4 is a bisected view of the first end 80 of the exemplary folded flexible cable 1 of FIG. 2 shown along line B-B'. FIG. 5 is a close-up view of the sensing head 501 of the flexible cable 1 of FIG. 2 shown along line B-B' with the mechanical and electrical connections assembled and with an electrical device 500 disposed therein.

Referring to FIG. 2 and FIG. 3, when the first section 7 is folded along the fold line 15, the first attach pad 11 is vertically aligned with the second attach pad 21, the gap 52 is vertically aligned with the third solder resist 73, and the fourth track 40 is aligned with the second portion 23 of the second electrically conductive track 20. When the first end 80 is pressed downward, the fourth track 40 is mechanically joined with the second portion 23. Since the fourth track 40 is electrically isolated from the other tracks, this connection need not be electrically conductive, although conductive adhesives may be used. In the embodiment depicted in FIGS. 2-5, the first end 80 is placed adjacent to an end of the second solder resist 72. As shown in FIG. 5, an electrical device 500 may be disposed between the first attach pad 11 and the second attach pad 21 with the second electrically conductive track 20 providing an electrical connection to the bottom or second side of the electrical device 500.

Referring to FIG. 2 and FIG. 4, when the first section is folded along the fold line 15, the first attach pad 11 is vertically aligned with the second attach pad 21, the first solder resist 71 is vertically aligned with the gap 50, and the second portion 13 of the first electrically conductive track 10 is vertically aligned with the second portion 33 of the third electrically conductive track 30. The third electrically conductive track 30 provides an electrical connection to the top or first side of an electrical device (not shown in FIG. 4) disposed between the first attach pad 11 and the second attach pad 21 by routing the connection through the first attach pad 11, along first electrically conductive track and to the third electrically conductive track 30. The joining of the first electrically conductive track 10 and the third electrically conductive track 30 is shown in FIG. 5.

Referring to FIG. 5, an electrical device 500 is disposed between the first attach pad 11 and the second attach pad 21 such that electrical connections are established. The layout of the flexible cable 1 allows it to be folded to make contact with both sides of the electrical device 500. The first end 80 of the flexible substrate 3 is flexed such that the second portion 13 of the first electrically conductive track 10 is mechanically and electrically joined to the second portion 33 of the third electrically conductive track 30. Any suitable conductive adhesive may be used to establish this connection. In one embodiment, conductive solder is used. In another embodiment, a conductive epoxy (e.g. a silver loaded epoxy) is used.

Figure 6:
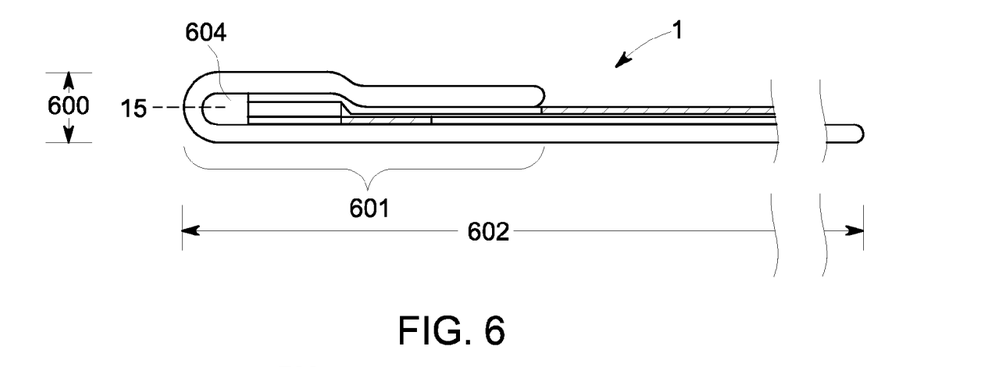
FIG. 6 is a profile view of an exemplary sensing head of a flexible cable.

FIG. 6 is a profile view of an exemplary sensing head 601 of a flexible cable 1. When assembled with the electrical device 500, the flexible cable 1 has a length 602 and a thickness 600. In one embodiment, the length 602 is about 95 mm when the device is folded. The thickness 600 is primarily determined by the thickness of the electric device 500. In one embodiment, the thickness 600 is 0.7 mm or less. In another embodiment, the thickness 600 is 0.5 mm or less. After folding, a space 604 is present near the fold line 15. In some embodiments it is desirable to fill the space 604 with a non-conductive material to add structural rigidity to the device and better protect the components from environmental effects such as moisture.

Figure 7:
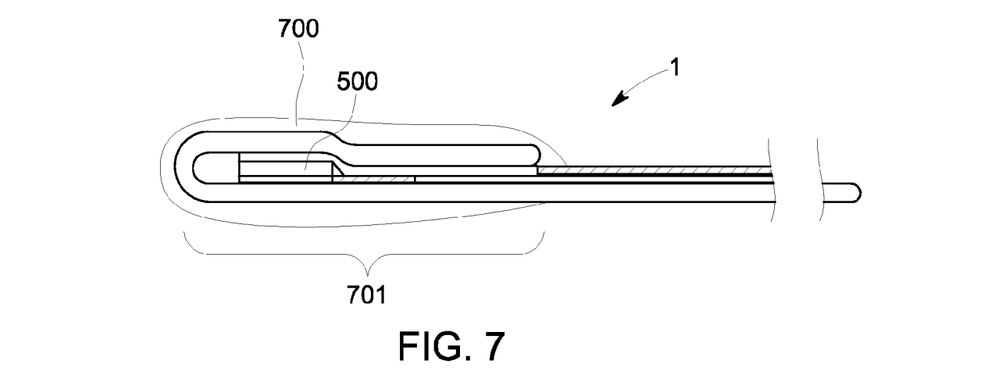
FIG. 7 is a profile view of an exemplary sensing head that has been covered with a conformal coating.

FIG. 7 is a profile view of an exemplary sensing head 701 of a flexible cable 1 that has been covered with a conformal coating 700. In the exemplary embodiment depicted in FIG. 7, a sensing head 701 of the flexible cable 1 is encased within a conformal coating 700 of non-conductive material. The conformal coating 700 adheres to the outer surface of the sensing head 701 and fills the empty space 604 (see FIG. 6). Any suitable non-conductive material may be used provided it does not interfere with the overall purpose of the device. In one embodiment, the electrical device 500 is a temperature sensor, such as a thermistor and the conformal coating is a silicon-based coating with high thermal conductivity. The thermal conductivity of the coating is selected so as to not interfere with the overall purpose of the device as a temperature probe.

Figure 8:
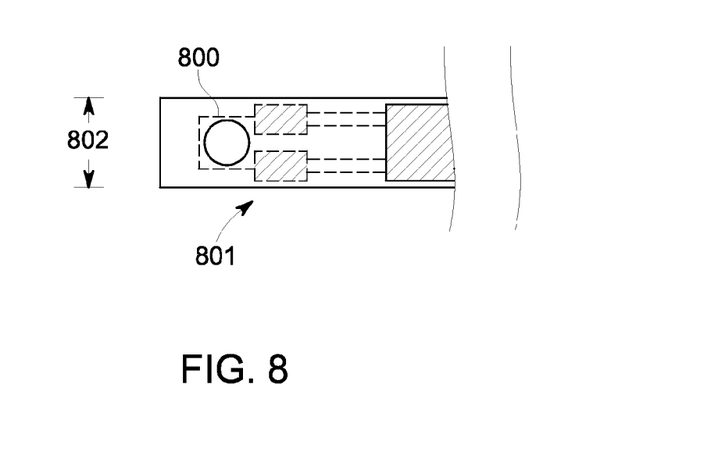
FIG. 8 is a top view of an exemplary sensing head that includes a window, which permits visualization of the connections to the electrical device.

FIG. 8 is a top view of an exemplary sensing head 801 that includes a window 800 which permits visualization of the connections to the electrical device 500. For example, the window 800 may permit one to see the proper flow of conductive solder and thereby provide visual assurance the electrical device 500 is properly connected. FIG. 8 also illustrates the width 802 of the flexible cable. Due to the efficient utilization of space, the terminus of the flexible cable has a relatively small width. In one embodiment, the flexible cable has a width 802 of about 3 mm or less. The second electrically conductive track 20 and the third electrically conductive track 30 are parallel over their entire lengths yet still connect to both sides of the device 500 without routing either track around the device. This permits certain embodiments to have a width 802 that is substantially uniform over the entire length of the flexible cable 1.

The flexible cables may be used in a variety of fields including, for example, monitoring a parameter such as temperature, pressure or vibration in an electric battery. By way of further example, a parameter may be measured at a certain location on a patient during a medical procedure or on a piece of equipment during a manufacturing process.

For certain applications it is desirable to include an alignment feature that assists a user in positioning the flexible cable at a predetermined position. For example, when monitoring the temperature of a battery pack, it may be desirable to locate the temperature sensor at a specific location. An exemplary battery pack is shown in FIG. 9.

Figure 9:
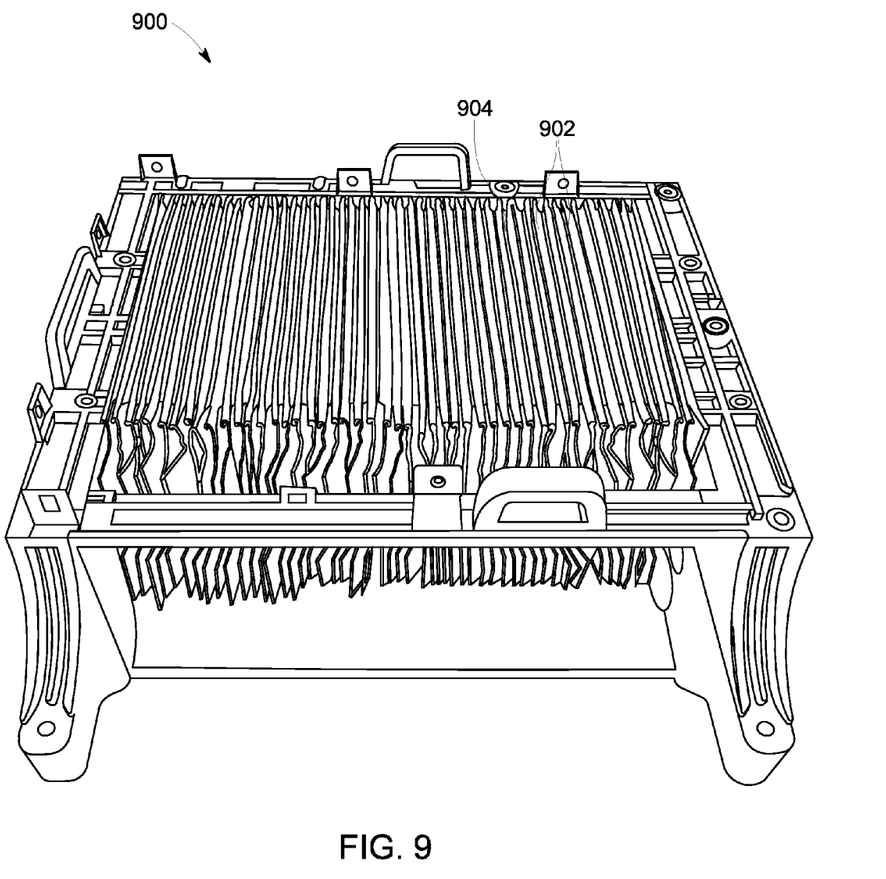
FIG. 9 depicts a battery pack with a plurality of cell pouches, which may have flexible cables disposed between pouches.

FIG. 9 depicts a battery pack 900 that is comprised of a series of cell pouches 902. Such battery packs 900 are used in a variety of fields, including the electric vehicle industry. To monitor and prevent overheating of the battery pack 900, it is desirable to determine the temperature between adjacent cell pouches 902. To use the space within the battery pack 900 in an efficient manner, it is also desirable to minimize the space 904 between adjacent cell pouches 902. A temperature sensor is needed that has a sufficiently low profile that it will fit in the space 904 between adjacent cell pouches while not significantly increasing the volume of the space 904. One or more flexible cables with temperature sensors may be disposed between select cell pouches to permit a user to measure the temperature at specific locations within the battery pack 800. When a temperature sensor is placed in the space 904 between adjacent cell pouches 902, the temperature sensor is prone to move during operation of the vehicle due to vibrations caused by the vehicle movement and/or expansion and contraction of the cell pouches 902. An alignment feature is present in certain embodiments that assists a user in positioning the flexible cable at a predetermined position and maintaining the flexible cable at that position.

Figure 10:
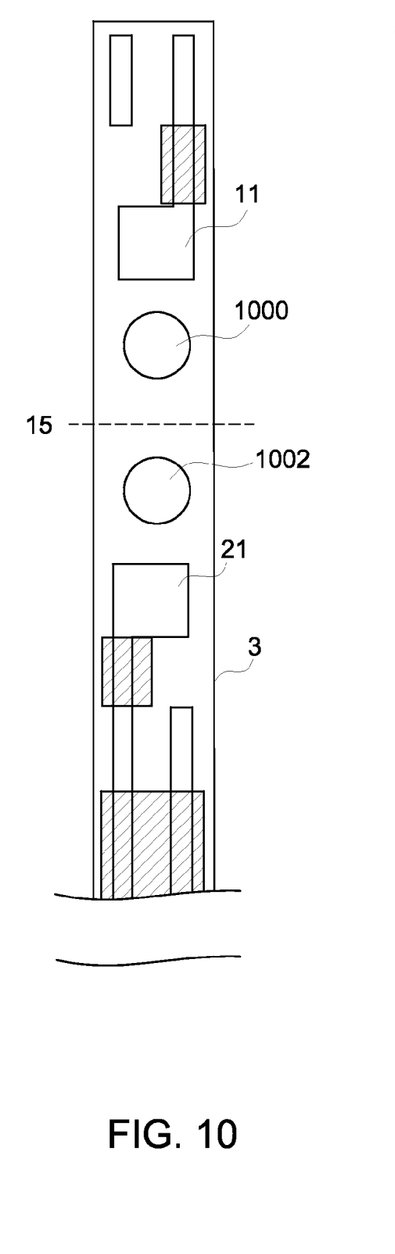
FIGS. 10-13 are close-up views of exemplary sensing heads of flexible cables that include a variety of alignment features.
Figure 11:
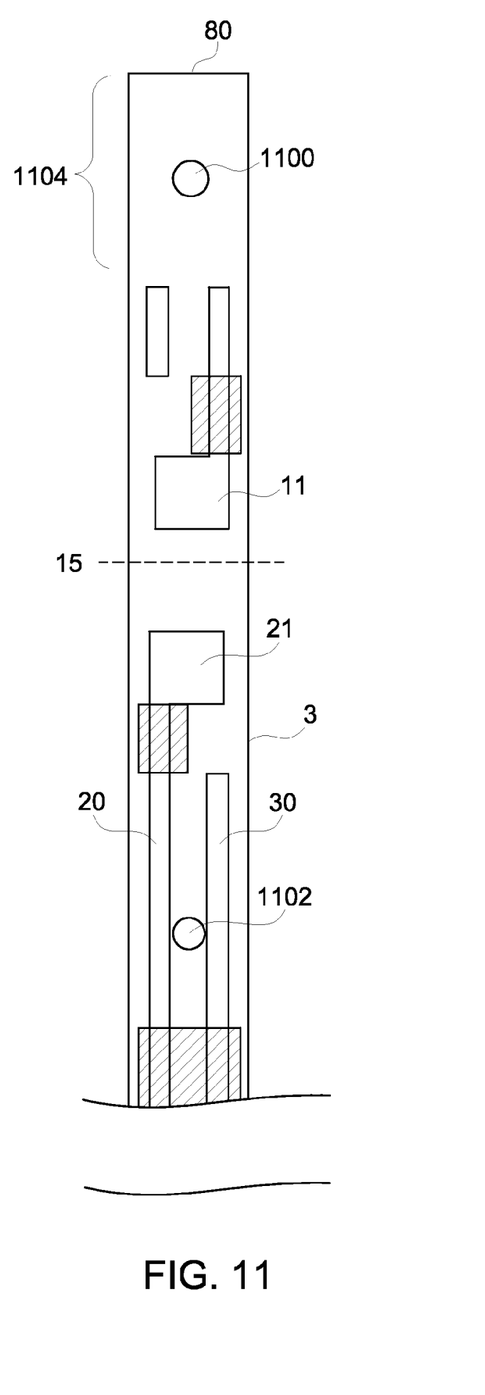

FIGS. 10-13 are close-up views of exemplary sensing heads of flexible cables that include a variety of alignment features. FIGS. 10 and 11 illustrate two exemplary alignment features. In FIG. 10, two holes 1000, 1002 in the flexible substrate 3 that are symmetrically disposed about the fold line 15. In the embodiment of FIG. 10, hole 1000 is disposed between the first attach pad 11 and the second attach pad 21 such that, after the first attach pad 11 and the second attach pad 21 have been folded on one another, the holes 1000, 1002 are aligned. The aligned holes may then be mated with a corresponding raised tab located at the predetermined position. For example, a raised tab may be disposed at the predetermined position between two cell pouches. In this fashion the flexible cable may be hooked at a predetermined position on a cell pouch. The embodiment of FIG. 11 is similar to the embodiment in FIG. 10 in that the two holes 1100, 1102 are provided in the flexible substrate 3 that are symmetrically disposed about the fold line 15 but differs from FIG. 11 with regard to the placement of the holes. A first hole 1100 is located between the first end 80 and the first attach pad 11 and the second hole 1102 is symmetrically disposed about the fold line 15 at a location between the second electrically conductive track 20 and the third electrically conductive track 30. To accommodate for the first hole 1100, the flexible substrate 3 includes an additional length 1104 between the terminal end of the third electrically conductive track 30 and the first end 80 of the flexible substrate 3.

Figure 12:
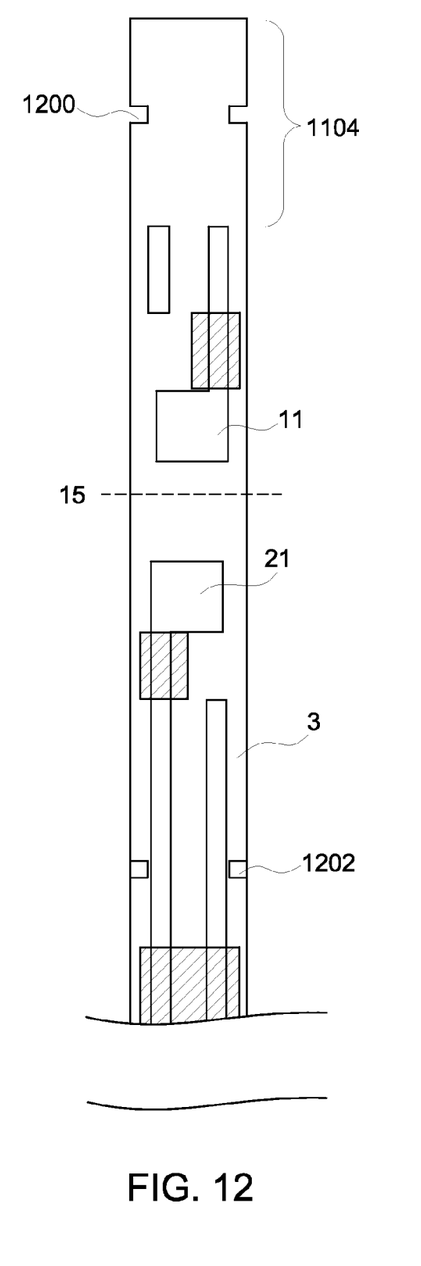
Figure 13:
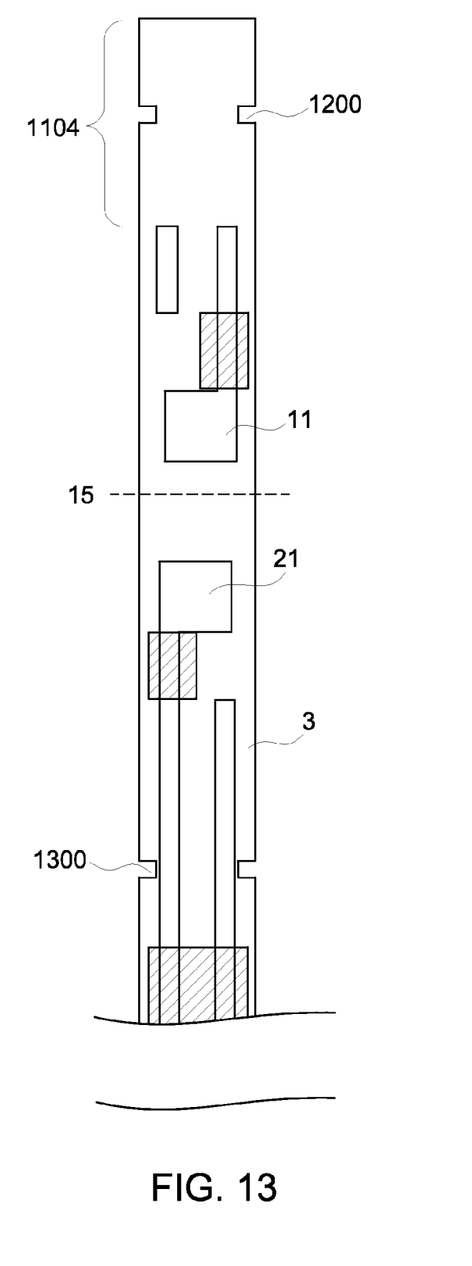

FIGS. 12 and 13 depict two alternative exemplary alignment features. The embodiments of FIGS. 12 and 13 both include additional length 1104 of the flexible substrate 3 and at least one notch 1200 cut into an edge of the flexible substrate 3. In FIG. 12, a raised tab 1202 is disposed on the second section 5 with the tab 1202 and the notch 1200 being symmetrically disposed about the fold line 15. When the notch 1200 is aligned with the tab 1202 the user can be assured the other components of the flexible cable are also properly aligned. In FIG. 13, a second notch 1300 is disposed on the second section 5 with the second notch 1300 and the notch 1200 being symmetrically disposed about the fold line 15. When the notch 1200 is aligned with the second notch 1300 the user can be assured the other components of the flexible cable are also properly aligned. Additionally, the aligned notches 1200, 1300 can mate with a corresponding raised tab located, e.g., at a predetermined position on a cell pouch.

Figure 14:
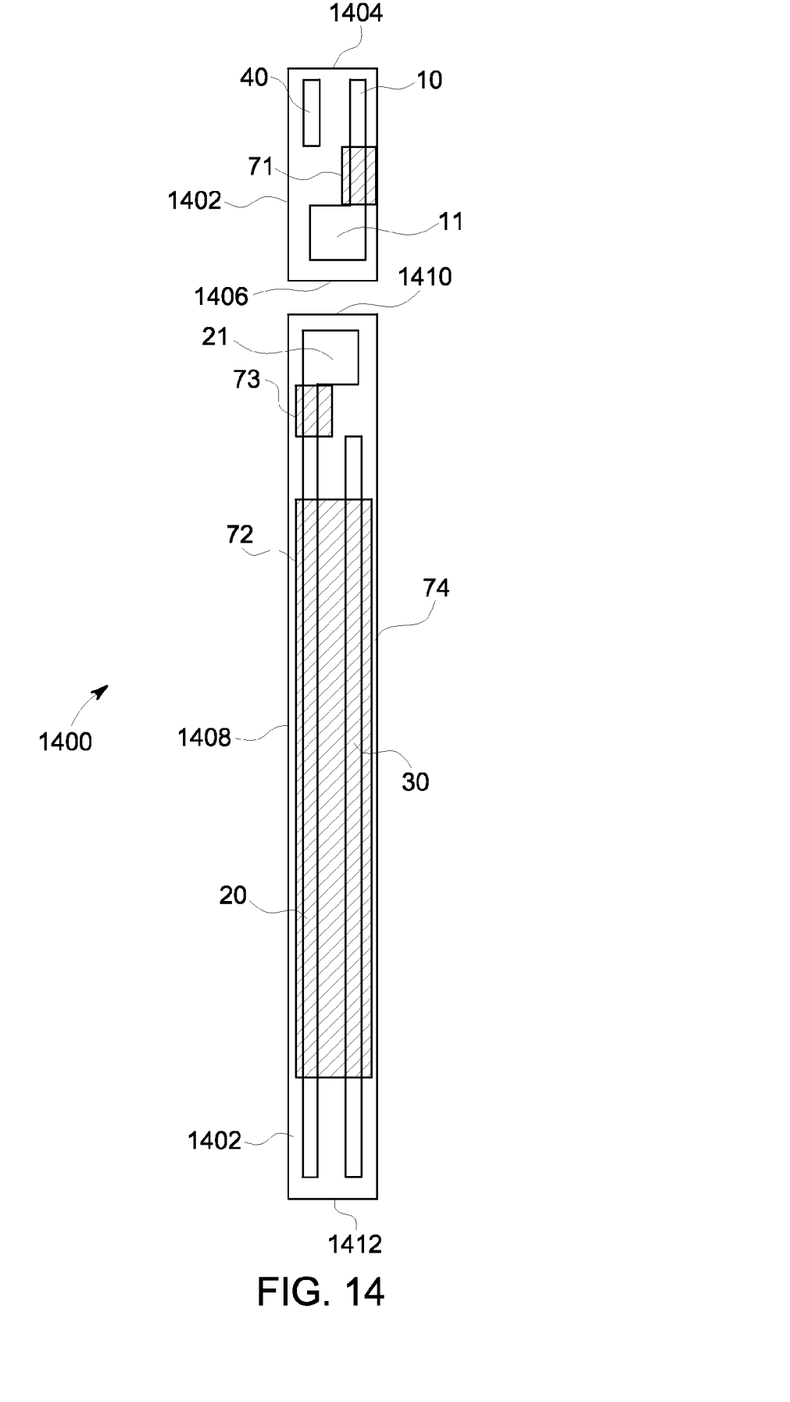
FIG. 14 is a top view of another exemplary flexible cable shown in an unfolded configuration.

FIG. 14 is a top view of another exemplary flexible cable 1400 shown in an unfolded configuration. The flexible cable 1400 includes a first flexible substrate 1402 with a first end 1404 and a second end 1406. The flexible cable 1400 further includes a second flexible substrate 1408 with a first end 1410 and a second end 1412. The flexible cable 1400 of FIG. 14 is similar to the flexible cable 1 of FIG. 1, except that the third section 9 of FIG. 1 has been omitted in the embodiment shown in FIG. 14. In use, the first flexible substrate 1402 is disposed on the second flexible substrate 1408 in a manner analogous to the folding of the flexible cable 1. The resulting substrate assembly may be sealed within a conformal coating, such as the conformal coating 700 of FIG. 7.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A flexible cable comprising:
    a flexible substrate comprising a first section at a first end of the flexible substrate, a second section at a second end of the flexible substrate opposite the first end of the flexible substrate, and a third section between the first section and the second section, wherein
    the first section of the flexible substrate comprises a first electrically conductive track disposed on the flexible substrate and a first attach pad disposed on the flexible substrate, wherein the first attach pad is located proximate to the third section and the first electrically conductive track connects to, and extends away from, the first attach pad toward the first end of the flexible substrate;
    the second section of the flexible substrate comprises a second electrically conductive track disposed on the flexible substrate, a third electrically conductive track disposed on the flexible substrate parallel to the second electrically conductive track, and a second attach pad disposed on the flexible substrate, wherein the second attach pad is located proximate the third section, the second electrically conductive track connects to, and extends away from, the second attach pad toward the second end of the flexible substrate, and the third electrically conductive track extends away from the second attach pad toward the second end of the flexible substrate leaving a gap between the second attach pad and the third electrically conductive track; and
    the third section of the flexible substrate comprises a foldable line located between the first attach pad and the second attach pad, wherein the first attach pad will align with the second attach pad when the first section of the flexible substrate is folded onto the second section of the flexible substrate.

2. The flexible cable of claim 1, further comprising a first solder resist disposed on a first portion of the first electrically conductive track, wherein the first solder resist extends away from the first attach pad toward the first end of the flexible substrate leaving a second portion of the first electrically conductive track proximate to the first end of the flexible substrate exposed for soldering.

3. The flexible cable of claim 2, wherein the first solder resist and the gap between the second attach pad have substantially the same lengths.

4. The flexible cable of claim 2, further comprising a second solder resist disposed on a first portion of the second electrically conductive track, wherein the second solder resist extends away from the second attach pad toward the second end of the flexible substrate leaving a second portion of the second electrically conductive track proximate to the second attach pad exposed for soldering and leaving a third portion of the second electrically conductive track proximate to the second end exposed for soldering.

5. The flexible cable of claim 4, wherein the second portion of the first electrically conductive track exposed for soldering and the second portion of the second electrically conductive track exposed for soldering have substantially the same lengths.

6. The flexible cable of claim 4, further comprising a third solder resist disposed on a fourth portion of the second electrically conductive track, wherein the third solder resist extends away from the second attach pad toward the second end of the flexible substrate while leaving the second portion of the second electrically conductive track exposed for soldering.

7. The flexible cable of claim 6, wherein the third solder resist and the gap between the first attach pad and the fourth track have substantially the same lengths.

8. The flexible cable of claim 6, further comprising a fourth solder resist disposed on a first portion of the third electrically conductive track, wherein the fourth solder resist extends away from the second attach pad toward the second end of the flexible substrate leaving a second portion of the third electrically conductive track proximate to the second attach pad exposed for soldering and leaving a third portion of the third electrically conductive track proximate to the second end exposed for soldering.

9. The flexible cable of claim 8, wherein the second portion of the second electrically conductive track and the fourth track have substantially the same lengths.

10. The flexible cable of claim 4, wherein the foldable line is located at an equal distance from both the first attach pad and the second attach pad.

11. The flexible cable of claim 1, wherein the first section of the flexible substrate 3 further comprises a fourth track disposed on the flexible substrate parallel to the first electrically conductive track, wherein the fourth track extends away from the first attach pad toward the first end of the flexible substrate leaving a gap between the first attach pad and the fourth track.

* * * * *